United States Patent
Wei

(10) Patent No.: US 10,935,679 B2
(45) Date of Patent: Mar. 2, 2021

(54) COUPLING EVALUATION GEOPHONE AND METHOD FOR ELIMINATING GROUND-GEOPHONE COUPLING EFFECT

(71) Applicants: SINOPEC OILFIELD SERVICE CORPORATION, Beijing (CN); CHINA PETROCHEMICAL CORPORATION, Beijing (CN); SINOPEC GEOPHYSICAL CORPORATION, Beijing (CN); SINOPEC GEOPHYSICAL CORPORATION, SHENGLI BRANCH, Dongying (CN); SHENGLI OILFIELD XINSHENG PETROLEUM GEOPHYSICAL TECHNOLOGY SERVICE CO. LTD, Dongying (CN)

(72) Inventor: Jidong Wei, Qingdao (CN)

( * ) Notice: Subject to any disclaimer, the term of this patent is extended or adjusted under 35 U.S.C. 154(b) by 555 days.

(21) Appl. No.: 15/795,410

(22) Filed: Oct. 27, 2017

(65) Prior Publication Data
US 2018/0067217 A1    Mar. 8, 2018

Related U.S. Application Data

(63) Continuation of application No. PCT/CN2015/000944, filed on Dec. 31, 2015.

(30) Foreign Application Priority Data

Apr. 27, 2015    (CN) .......................... 201520258826.8

(51) Int. Cl.
*G01V 1/18*    (2006.01)
*G01V 1/16*    (2006.01)
(Continued)

(52) U.S. Cl.
CPC .............. *G01V 1/182* (2013.01); *G01V 1/166* (2013.01); *G01V 1/18* (2013.01); *G01V 1/181* (2013.01);
(Continued)

(58) Field of Classification Search
CPC ... G01V 1/18; G01V 1/20; G01V 1/28; G01V 1/36; G01V 1/181; G01V 1/182;
(Continued)

(56) References Cited

U.S. PATENT DOCUMENTS

2010/0088039 A1*   4/2010   Yang .................. G01N 33/6848
                                                                                         702/23
2010/0195439 A1*   8/2010   Muyzert .................. G01V 1/18
                                                                                         367/56
(Continued)

FOREIGN PATENT DOCUMENTS

CN          101672924 A      3/2010
CN          102288988 A     12/2011
(Continued)

*Primary Examiner* — Hovhannes Baghdasaryan
*Assistant Examiner* — Amie M Ndure
(74) *Attorney, Agent, or Firm* — Erson IP (Nelson IP)

(57) ABSTRACT

The present disclosure discloses a coupling evaluation geophone, comprising piezoelectric ceramic crystal 1, 2 and 3, a geophone 4 and a relevant supplying circuit. Three piezoelectric ceramic crystals 1, 2 and 3 are respectively provided on the top and two lateral sides of the geophone 4. By processing measurement data derived from the coupling evaluation geophone, a ground-geophone coupling effect is obtained at a corresponding embedment point of the coupling evaluation geophone. An effect of the ground-geophone coupling on an earthquake data can be eliminated by calculation. Data detected by the coupling evaluation geophone is improved in fidelity, Signal/Noise ratio and resolution.

12 Claims, 3 Drawing Sheets

(51) Int. Cl.
*G01V 1/20* (2006.01)
*G01V 1/28* (2006.01)
*G01V 1/36* (2006.01)
*H01L 41/113* (2006.01)
*H01L 41/25* (2013.01)

(52) U.S. Cl.
CPC ............... *G01V 1/20* (2013.01); *G01V 1/282* (2013.01); *G01V 1/364* (2013.01); *H01L 41/113* (2013.01); *H01L 41/25* (2013.01); *G01V 2200/14* (2013.01); *G01V 2210/3246* (2013.01)

(58) Field of Classification Search
CPC ........ G01V 1/282; G01V 1/364; G01V 1/166; H01L 41/113; H01L 41/25; G01N 33/50; G01N 33/5079; C09C 3/10; C09C 1/30; C09C 3/00; C09C 1/48; C09C 1/56; C09C 1/00; C09C 1/346; C09C 1/24; C04B 24/122; C04B 16/00; C04B 24/2641; C04B 24/32; C04B 40/0042; C04B 14/308; C04B 22/06; C04B 14/30; C04B 14/022; C04B 14/305; C04B 2103/54; C04B 24/02; C04B 28/08; C04B 28/02; C04B 28/04; C04B 14/307; C04B 24/00; C04B 18/146
See application file for complete search history.

(56) References Cited

U.S. PATENT DOCUMENTS

| | | | |
|---|---|---|---|
| 2010/0202252 | A1 | 8/2010 | Ounadjela et al. |
| 2010/0302909 | A1* | 12/2010 | Muyzert ............... G01V 1/181 367/178 |
| 2011/0189440 | A1* | 8/2011 | Appleby ............... B29C 33/301 428/156 |
| 2015/0026847 | A1* | 1/2015 | Pai ........................ G01Q 60/16 850/29 |

FOREIGN PATENT DOCUMENTS

| | | | |
|---|---|---|---|
| CN | 102323616 A | 1/2012 | |
| CN | 103941283 A | 7/2014 | |
| CN | 204556849 U | 8/2015 | |
| FR | 2530108 A1 * | 1/1984 | ............... H04R 1/04 |
| FR | 2530108 A1 | 1/1984 | |
| JP | 2000235042 A | 8/2000 | |

* cited by examiner

_US 10,935,679 B2_

COUPLING EVALUATION GEOPHONE AND METHOD FOR ELIMINATING GROUND-GEOPHONE COUPLING EFFECT

TECHNICAL FIELD

The present disclosure relates to a field of ground vibration measurement by sensor, and specially to a coupling evaluation geophone.

BACKGROUND

In theory, a ground-geophone coupling system is an unchanged vibration system in linear regression. An impulse response will be obtained if a mechanical impulse is imposed as an input and the corresponding input is measured. However, an impulse excitation is a transient excitation which should be constantly stable in a frequency range of $-\infty \sim +\infty$ but never exists in reality. Some equipments such as shaking table, exciter, vibration machine and exciting hammer are utilized usually for approximation in a certain frequency band range. However, the equipments mentioned above cannot fulfill a requirement of modeling an impulse obtained from an geophone in a seismic exploration. Thus, a novel coupling evaluation geophone is invented to solve the mentioned problems.

SUMMARY

The present disclosure is to provide a geophone which is able to detect an impulse response of ground-geophone coupling system.

Technical solutions to achieve an objective of the present disclosure are as follows.

A coupling evaluation geophone comprises a first piezoelectric ceramic crystal and a geophone. The first piezoelectric ceramic crystal is provided at a top end of the geophone. The coupling evaluation geophone also comprises a second piezoelectric ceramic crystal and a third piezoelectric ceramic crystal. The second piezoelectric ceramic crystal is provided at a first lateral side of the geophone. The third piezoelectric ceramic crystal is provided at a second lateral side of the geophone perpendicular to the first lateral side of the geophone.

The objective of the present disclosure can also be achieved by following technical solutions.

The first piezoelectric ceramic crystal is provided at the center of the top end inside a housing of the coupling evaluation geophone. The second piezoelectric ceramic crystal and the third piezoelectric ceramic crystal are respectively provided at the centers of the first lateral side and the second lateral inside the housing of the coupling evaluation geophone. The second piezoelectric ceramic crystal and the third piezoelectric ceramic crystal are adhered on the housing of the coupling evaluation geophone by an industrial glue.

The first piezoelectric ceramic crystal, the second piezoelectric ceramic crystal and the third piezoelectric ceramic crystal are made of piezoelectric materials comprising barium titanate, lead zirconate titanate and modified lead zirconate titanate.

The first piezoelectric ceramic crystal, the second piezoelectric ceramic crystal and the third piezoelectric ceramic crystal has a round shape or a square shape.

A size parameter and a weight parameter of the first piezoelectric ceramic crystal, the second piezoelectric ceramic crystal or the third piezoelectric ceramic crystal enable an output signal to be larger than an ambient noise.

A thickness of the first piezoelectric ceramic crystal, the second piezoelectric ceramic crystal or the third piezoelectric ceramic crystal enables the output vibration signal to be larger than the ambient noise and maintains a distance of at least 2 mm to an inner core of the coupling evaluation geophone.

The coupling evaluation geophone includes a piezoelectric crystal combined with a moving-coil modeling geophone, or a Micro-Electro-Mechanical System (MEMS) digital geophone, or a piezoelectric geophone or an eddy geophone.

An impulse strength produced by the first piezoelectric ceramic crystal, the second piezoelectric ceramic crystal and the third piezoelectric ceramic crystal should proceeds an extent of ambient noise.

Process methods required for parameter identification on data recorded by the coupling evaluation geophone comprises multiple stacking, eliminating low frequency and confining a frequency in 300-600 Hz.

The coupling evaluation geophone in the present disclosure, is able to obtain an impulse response to the ground-geophone coupling system, by processing an output signal from the geophone excited by a mechanical impulse. A theory of single-degree-of-freedom system vibration in mechanics of vibration, and related technology and methods for processing and analysis such as processing and analysis on digital signal, signal and system, as well as analysis on seismic data characteristics are applied in the present disclosure. An effect of the ground-geophone coupling on an earthquake data can be eliminated by calculation. Data detected by the coupling evaluation geophone is improved in fidelity, Signal/Noise ratio and resolution.

A method for eliminating a ground-geophone coupling effect using the coupling evaluation geophone comprises the following steps:
  step a: obtaining measurement data from the coupling evaluation geophone;
  step b: obtaining the ground-geophone coupling effect at a corresponding embedment point of the coupling evaluation geophone by fitting and modeling;
  step c: calculating an effect of the ground-geophone coupling on an earthquake data by anti-coupling deconcolution
  step d: obtaining earth vibration data with a high fidelity, Signal/Noise ratio as well as resolution.

The coupling evaluation geophone in step a comprises a first piezoelectric ceramic crystal and a geophone. The first piezoelectric ceramic crystal is provided at the top of the geophone, and the coupling evaluation geophone also comprises a second piezoelectric ceramic crystal and a third piezoelectric ceramic crystal. The second piezoelectric ceramic crystal is provided at a first lateral side of the geophone. and the third piezoelectric ceramic crystal is provided at a second lateral side of the geophone perpendicular to the first lateral side of the geophone.

Further, a square-wave generator provides power to the piezoelectric ceramic crystals. Further, a 40V, 0.5-2 Hz square wave is input to the piezoelectric ceramic crystals, with a sample interval of 0.5 ms and a record length of 10 s.

Further, in step b, a formula is utilized in a frequency response:

$$H_{out}(\omega) = \frac{-\omega^2}{\omega_0^2 - \omega^2 + 2j\omega_0\xi\omega}.$$

In the formula, $H_{out}(\omega)$ is a frequency response to "ground-geophone coupling effect" output by the coupling evaluation geophone, and $\omega_0$ is a system eigen circular frequency, and $\xi$ is an eigen damping coefficient, and $\omega$ is an circular frequency, and values of $\omega_0$ and $\xi$ are fitted data according to experiments.

Further, in step c, a frequency response formula $$F_{sys} = \frac{\omega_0^2 + 2j\omega_0\xi\omega}{m(\omega_0^2 - \omega^2 + 2j\omega_0\xi\omega)}$$

is adopted; in the formula, $F_{sys}$ is a frequency response for eliminating the ground-geophone coupling effect and m is mass of a mass block in kg.

DETAILED DESCRIPTION

Preferred embodiments are given below with drawings for understanding the objective and characteristics of the present disclosure.

Figure 1:
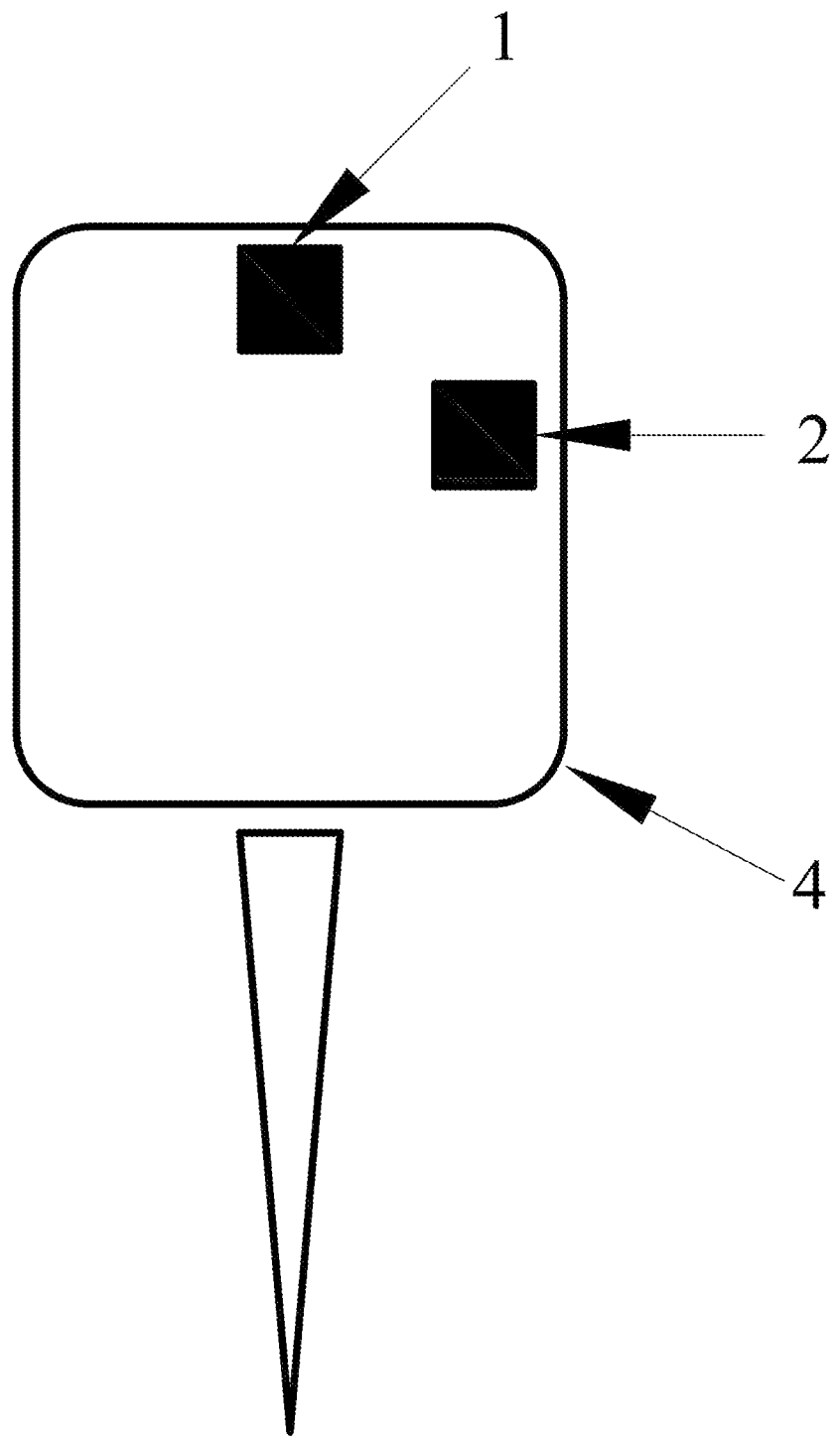
FIG. 1 shows a front view of the coupling evaluation geophone in the embodiment of the present disclosure.
Figure 2:
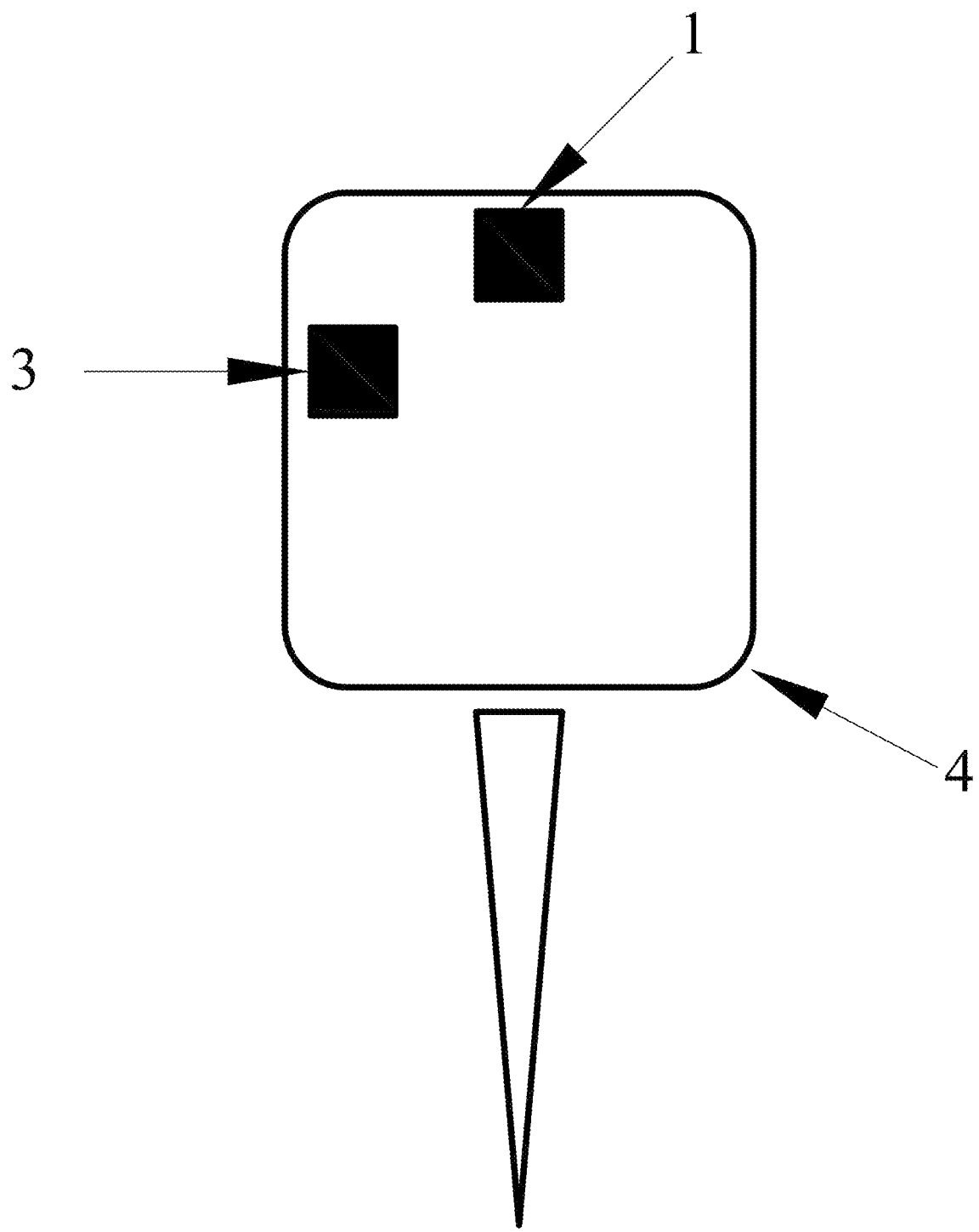
FIG. 2 shows a left view of the coupling evaluation geophone in the embodiment of the present disclosure.
Figure 3:
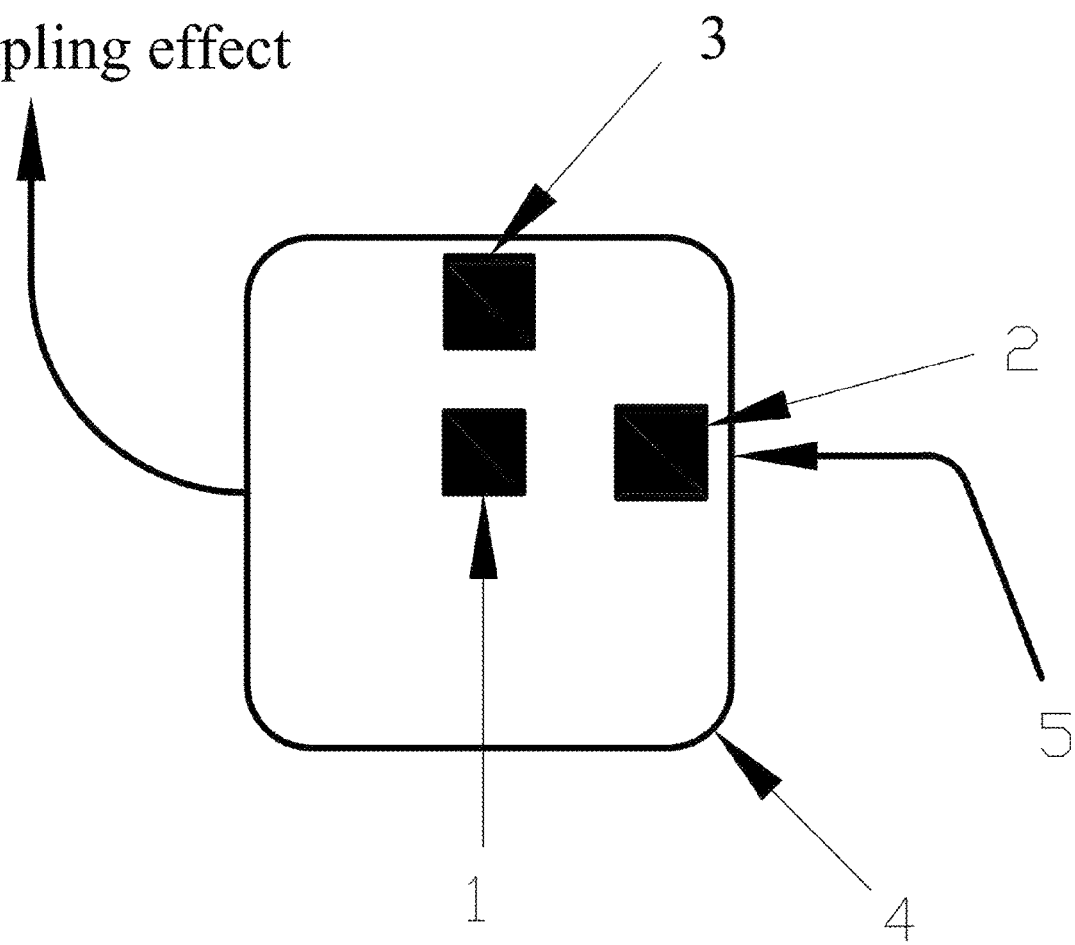
FIG. 3 shows a top view of the coupling evaluation geophone in the embodiment of the present disclosure.

As shown in FIG. 1, FIG. 2 and FIG. 3, the coupling evaluation geophone comprises a first piezoelectric ceramic crystal 1, a second piezoelectric ceramic crystal 2, a third piezoelectric ceramic crystal 3 and a geophone 4. The first piezoelectric ceramic crystal 1 is provided at the top of the geophone 4. The second piezoelectric ceramic crystal 2 is provided at the first lateral side of the geophone 4. The third piezoelectric ceramic crystal 3 is provided at the second lateral side of the geophone 4 perpendicular to the first lateral side of the geophone.

In the embodiment, the first piezoelectric ceramic crystal 1, the second piezoelectric ceramic crystal 2 and the third piezoelectric ceramic crystal 3 are provided inside the housing of the coupling evaluation geophone (top and two lateral sides). These three piezoelectric ceramic crystals 1, 2, and 3 are adhered tightly on the housing of the coupling evaluation geophone by an industrial glue.

In the embodiment, the first piezoelectric ceramic crystal 1, the second piezoelectric ceramic crystal 2 and the third piezoelectric ceramic crystal 3 are made of piezoelectric materials comprising barium titanate, lead zirconate titanate and modified lead zirconate titanate.

The first piezoelectric ceramic crystal 1, the second piezoelectric ceramic crystal 2 and the third piezoelectric ceramic crystal 3 has a round shape or a square shape. The smaller of the weight and the size of the piezoelectric ceramic crystals 1, 2, and 3, the better they will be.

In the embodiment, the size and the weight of the first piezoelectric ceramic crystal 1, the second piezoelectric ceramic crystal 2 or the third piezoelectric ceramic crystal 3 enable the output signal to be larger than the ambient noise. Therefore, specific parameters should be determined by experiments according to different materials. Since different materials are different in electromechanical properties, only experiments can make sure that impulses produced by the piezoelectric ceramic crystals 1, 2, and 3 exceed the extents of the ambient noise. The output speed should exceed the speed of the ambient noise to improve an accuracy of identification.

In the embodiment, thickness of the first piezoelectric ceramic crystal, the second piezoelectric ceramic crystal and the third piezoelectric ceramic crystal are determined according to a kind of the piezoelectric ceramic crystal and mode of combination. In general, the output vibration signal should be higher than the ambient noise and the piezoelectric ceramic crystals should maintain a distance of at least 2 mm to an inner core of the coupling evaluation geophone.

In the embodiment, the coupling evaluation geophone includes a piezoelectric crystal combined with a moving-coil modeling geophone, or an MEMS digital geophone, or a piezoelectric geophone or an eddy geophone and the like.

The square-wave generator 5 provides power to the piezoelectric ceramic crystals during an operation of the coupling evaluation geophone. The output signal from geophone 4 after processing is deemed as an coupling effect of the geophone under the coupling. If the geophone 4 only has vertical component, only the first piezoelectric ceramic crystal provided on the top of is needed. On this basis, the perpendicular provision of the second piezoelectric ceramic crystal and the third piezoelectric ceramic crystal is because that the ground medium appears anisotropy. The coupling effects of these three piezoelectric ceramic crystals are different.

The present disclosure provides a geophone with an ability of automatically measuring a ground-geophone coupling effect, which is short for "coupling evaluation geophone". The coupling evaluation geophone comprises a plurality of piezoelectric ceramic crystals, a geophone and a relevant supplying circuit. Three piezoelectric ceramic crystals are respectively provided on the top and two lateral sides of the geophone. By processing measurement data derived from the coupling evaluation geophone such as taking a certain sample interval (0.5 ms sample interval ensures a high Signal to Noise (S/N) ratio and is practical in a field), a ground-geophone coupling effect is obtained at a corresponding embedment point of the coupling evaluation geophone. An effect of the ground-geophone coupling on an earthquake data can be eliminated by calculation. Data detected by the coupling evaluation geophone is improved in fidelity, S/N ratio and resolution. The processing method for data analysis comprises the multiple stacking, eliminating low frequency and identification at 300-600 Hz and the like. By refining the parameter requirements for the input signal from the supply circuit, mathematic description after the multiple stacking is facilitated.

The method for eliminating a ground-geophone coupling effect using the coupling evaluation geophone comprises the following steps.

Step a. obtaining measurement data from the coupling evaluation geophone. The coupling evaluation geophone in step a comprises a first piezoelectric ceramic crystal and a geophone. The first piezoelectric ceramic crystal is provided at the top of the geophone, and the coupling evaluation geophone also comprises a second piezoelectric ceramic crystal and a third piezoelectric ceramic crystal. The second piezoelectric ceramic crystal is provided at a first lateral side of the geophone. and the third piezoelectric ceramic crystal is provided at a second lateral side of the geophone perpendicular to the first lateral side of the geophone. A square-wave generator provides power to the piezoelectric ceramic crystals. A 40 v, 0.5-2 Hz square-wave generator provides power to the piezoelectric ceramic crystals, with a sample interval of 0.5 ms and a record length of 10 s.

Step b. obtaining the ground-geophone coupling effect at a corresponding embedment point of the coupling evaluation geophone by fitting and modeling. The corresponding coupling parameters are obtained by multiple stacking, eliminating low frequency and identifying at 300-600 Hz. Preferably, the frequency response formula is:

$$H_{out}(\omega) = \frac{-\omega^2}{\omega_0^2 - \omega^2 + 2j\omega_0\xi\omega}$$

In the formula, $H_{out}(\omega)$ is a frequency response to "ground-geophone coupling effect" output by the coupling evaluation geophone, and $\omega_0$ is a system eigen circular frequency, and $\xi$ is an eigen damping coefficient, and $\omega$ is a circular frequency, and values of $\omega_0$ and $\xi$ are fitted data according to experiments.

Step c. calculating an effect of the ground-geophone coupling on an earthquake data by anti-coupling deconcolution. Preferably, the frequency response formula is adopted:

$$F_{sys} = \frac{\omega_0^2 + 2j\omega_0\xi\omega}{m(\omega_0^2 - \omega^2 + 2j\omega_0\xi\omega)}.$$

In the formula, $F_{sys}$ is a frequency response for eliminating the ground-geophone coupling effect and m is mass of a mass block in kg.

Step d. obtaining earth vibration data with a high fidelity, S/N ratio as well as resolution.

What is claimed is:

1. A coupling evaluation geophone, comprising:
    a first piezoelectric ceramic crystal, a second piezoelectric ceramic crystal, a third piezoelectric ceramic crystal and a geophone;
    wherein the first piezoelectric ceramic crystal is provided at the top of the geophone; the second piezoelectric ceramic crystal is provided at a first lateral side of the geophone; and the third piezoelectric ceramic crystal is provided at a second lateral side of the geophone perpendicular to the first lateral side of the geophone;
    wherein a square-wave generator provides power to the first piezoelectric ceramic crystal, the second piezoelectric ceramic crystal and the third piezoelectric ceramic crystal; and a coupling effect is obtained from a processed output signal from the coupling evaluation geophone,
    wherein a 40V, 0.5-2 Hz square wave is output from the square-wave generator to the first piezoelectric ceramic crystal, the second piezoelectric ceramic crystal and the third piezoelectric ceramic crystal; and
    corresponding parameters for the coupling system are obtained by eliminating low frequency and multiple stacking within a range of 300-600 Hz with a sample interval of 0.5 ms and a record length of 10 s.

2. The coupling evaluation geophone according to claim 1, wherein the first piezoelectric ceramic crystal is provided at the center of the top inside a housing of the coupling evaluation geophone;
    the second piezoelectric ceramic crystal and the third piezoelectric ceramic crystal are respectively provided at the centers of the first lateral side and the second lateral side inside the housing of the coupling evaluation geophone; and
    the second piezoelectric ceramic crystal and the third piezoelectric ceramic crystal are adhered on the housing of the coupling evaluation geophone by an industrial glue.

3. The coupling evaluation geophone according to claim 1, wherein the first piezoelectric ceramic crystal, the second piezoelectric ceramic crystal and the third piezoelectric ceramic crystal are made of piezoelectric materials comprising barium titanate, lead zirconate titanate and modified lead zirconate titanate.

4. The coupling evaluation geophone according to claim 1, wherein the first piezoelectric ceramic crystal, the second piezoelectric ceramic crystal and the third piezoelectric ceramic crystal have a circular or square shape.

5. The coupling evaluation geophone according to claim 1, wherein a size parameter and a weight parameter of the first piezoelectric ceramic crystal, the second piezoelectric ceramic crystal or the third piezoelectric ceramic crystal enable an output signal to be larger than an ambient noise.

6. The coupling evaluation geophone according to claim 1, wherein a thickness of the first piezoelectric ceramic crystal, the second piezoelectric ceramic crystal or the third piezoelectric ceramic crystal enables an output vibration signal to be larger than an ambient noise and maintains a distance of at least 2 mm to an inner core of the coupling evaluation geophone.

7. The coupling evaluation geophone according to claim 1, wherein the coupling evaluation geophone includes a piezoelectric crystal combined with a moving-coil modeling geophone, or a Micro-Electro-Mechanical System (MEMS) digital geophone, or a piezoelectric geophone or an eddy geophone.

8. The coupling evaluation geophone according to claim 1, wherein an impulse strength produced by the first piezoelectric ceramic crystal, the second piezoelectric ceramic crystal and the third piezoelectric ceramic crystal proceeds an extent of ambient noise, or an output speed of the first piezoelectric ceramic crystal, the second piezoelectric ceramic crystal and the third piezoelectric ceramic crystal proceeds speed of ambient noise.

9. A method for eliminating a ground-geophone coupling effect using the coupling evaluation geophone of claim 1, wherein the method comprises the following steps:
    step a: obtaining measurement data from the coupling evaluation geophone;
    step b: obtaining the ground-geophone coupling effect at a corresponding embedment point of the coupling evaluation geophone by fitting and modeling; and
    step c: calculating an effect of the ground-geophone coupling effect on an earthquake data by anti-coupling deconcolution;
    the coupling evaluation geophone in step a comprises a first piezoelectric ceramic crystal and a geophone;
    the first piezoelectric ceramic crystal is provided at the top of the geophone, and the coupling evaluation geophone also comprises a second piezoelectric ceramic crystal and a third piezoelectric ceramic crystal;
    the second piezoelectric ceramic crystal is provided at a first lateral side of the geophone; and the third piezoelectric ceramic crystal is provided at a second lateral side of the geophone perpendicular to the first lateral side of the geophone;

wherein in the step a, a 40V, 0.5-2 Hz square wave is input to the piezoelectric ceramic crystals, with a sample interval of 0.5 ms and a record length of 10 s.

10. The method for eliminating the ground-geophone coupling effect using the coupling evaluation geophone according to claim 9, wherein in the step a, a square-wave generator provides power to the piezoelectric ceramic crystals.

11. The method for eliminating a ground-geophone coupling effect using the coupling evaluation geophone according to claim 9, wherein in the step b, a frequency response formula is adopted:

$$H_{out}(\omega) = \frac{-\omega^2}{\omega_0^2 - \omega^2 + 2j\omega_0\xi\omega};$$

in the formula, $H_{out}(\omega)$ is a frequency response to "ground-geophone coupling effect" output by the coupling evaluation geophone, and $\omega_0$ is a system eigen circular frequency, and $\xi$ is an eigen damping coefficient, and $\omega$ is a circular frequency, and values of $\omega_0$, and $\xi$ are fitted data according to experiments.

12. The method for eliminating the ground-geophone coupling effect using the coupling evaluation geophone according to claim 11, wherein in the step c, a frequency response formula $$F_{sys} = \frac{\omega_0^2 + 2j\omega_0\xi\omega}{m(\omega_0^2 - \omega^2 + 2j\omega_0\xi\omega)}$$

is adopted; and in the formula, $F_{sys}$ is a frequency response for eliminating the ground-geophone coupling effect and m is a mass of a mass block in kg.

* * * * *